(12) United States Patent
Soga et al.

(10) Patent No.: US 6,521,538 B2
(45) Date of Patent: Feb. 18, 2003

(54) METHOD OF FORMING A TRENCH WITH A ROUNDED BOTTOM IN A SEMICONDUCTOR DEVICE

(75) Inventors: Hajime Soga, Toyota (JP); Kenji Kondo, Hoi-gun (JP); Eiji Ishikawa, Okazaki (JP); Yoshikazu Sakano, Obu (JP); Mikimasa Suzuki, Toyohashi (JP)

(73) Assignee: Denso Corporation, Kariya (JP)

(*) Notice: Subject to any disclaimer, the term of this patent is extended or adjusted under 35 U.S.C. 154(b) by 0 days.

(21) Appl. No.: 09/790,888

(22) Filed: Feb. 23, 2001

(65) Prior Publication Data

US 2001/0023960 A1 Sep. 27, 2001

(30) Foreign Application Priority Data

Feb. 28, 2000 (JP) ........................................ 2000-051318

(51) Int. Cl.[7] ............................................. H01L 21/311
(52) U.S. Cl. ....................... 438/695; 438/696; 438/700
(58) Field of Search ................................ 438/589, 694, 438/696, 700, 710–714, 738, 739, 701, 702, 706, 695, 733, 735

(56) References Cited

U.S. PATENT DOCUMENTS

| | | | |
|---|---|---|---|
| 4,693,781 A | | 9/1987 | Leung et al. |
| 4,729,815 A | * | 3/1988 | Leung ........................ 438/714 |
| 4,839,306 A | | 6/1989 | Wakamatsu |
| 5,236,861 A | | 8/1993 | Otsu |
| 5,321,289 A | | 6/1994 | Baba et al. |
| 5,578,518 A | * | 11/1996 | Koike et al. ........ 148/DIG. 161 |
| 5,726,088 A | | 3/1998 | Yanagiya et al. |
| 5,891,807 A | | 4/1999 | Muller et al. |
| 6,008,131 A | * | 12/1999 | Chen ........................... 438/710 |
| 6,090,718 A | | 7/2000 | Soga et al. |
| 6,117,734 A | * | 9/2000 | Nakamura .................. 438/268 |
| 6,198,150 B1 | * | 3/2001 | Gelzinis ...................... 257/374 |

FOREIGN PATENT DOCUMENTS

| | | |
|---|---|---|
| EP | 0684637 | 11/1995 |
| JP | A-60-68650 | 4/1985 |
| JP | A-60-158642 | 8/1985 |
| JP | A-60-219759 | 11/1985 |
| JP | A-61-119056 | 6/1986 |
| JP | B2-6-18248 | 12/1986 |
| JP | 62-73737 | 4/1987 |
| JP | A-62-136065 | 6/1987 |
| JP | B2-2602808 | 7/1987 |
| JP | A-62-160731 | 7/1987 |
| JP | A-62-185353 | 8/1987 |
| JP | B2-6-24228 | 10/1987 |

(List continued on next page.)

OTHER PUBLICATIONS

U.S. patent application Ser. No. 09/143,513, Ishikawa et al., filed Aug. 28, 1998.
U.S. patent application Ser. No. 09/630,786, Ishikawa et al., filed Aug. 2, 2000.
U.S. patent application Ser. No. 09/758,377, Aoki et al., filed Jan. 12, 2001.
Fonash, S.J. "Damage Effects in Dry Etching" in: *Solid State Technology* (Apr. 1985), pp. 201–205.

Primary Examiner—Olik Chaudhuri
Assistant Examiner—Hoai Pham
(74) Attorney, Agent, or Firm—Law Offices of David G. Posz

(57) ABSTRACT

In a method for manufacturing a semiconductor device, first, a trench is formed on a semiconductor substrate by anisotropic etching, and a reaction product is produced and deposited on the inner wall of the trench during the anisotropic etching. Then, isotropic etching is performed to round a corner of a bottom portion of the trench without removing the reaction product. The isotropic etching can round the corner of the trench without etching the side wall of the trench that is covered by the reaction product.

26 Claims, 7 Drawing Sheets

FOREIGN PATENT DOCUMENTS

| | | |
|---|---|---|
| JP | A-62-293661 | 12/1987 |
| JP | A-63-2371 | 1/1988 |
| JP | B2-7-48547 | 5/1988 |
| JP | A-63-115358 | 5/1988 |
| JP | A-63-166230 | 7/1988 |
| JP | 63-229743 | 9/1988 |
| JP | A-63-229845 | 9/1988 |
| JP | A-63-278338 | 11/1988 |
| JP | 63-318768 | 12/1988 |
| JP | B2-2794565 | 2/1989 |
| JP | B2-5-75184 | 3/1989 |
| JP | 64-57623 | 3/1989 |
| JP | B2-2519474 | 3/1989 |
| JP | B2-2671312 | 3/1989 |
| JP | B2-2552152 | 4/1989 |
| JP | B2-2635607 | 4/1989 |
| JP | A-63-234534 | 6/1989 |
| JP | A-1-196134 | 8/1989 |
| JP | A-1-216538 | 8/1989 |
| JP | A-2-3956 | 1/1990 |
| JP | 2-54557 | 2/1990 |
| JP | A-2-260-424 | 10/1990 |
| JP | 2-260424 | 10/1990 |
| JP | A-2-260660 | 10/1990 |
| JP | A-271620 | 11/1990 |
| JP | A-2-271618 | 11/1990 |
| JP | A-2-271619 | 11/1990 |
| JP | A-3-147327 | 6/1991 |
| JP | A-252131 | 11/1991 |
| JP | A-4-37152 | 2/1992 |
| JP | B2-2667552 | 2/1992 |
| JP | B2-2589209 | 5/1992 |
| JP | 5-55361 | 3/1993 |
| JP | A-5-102297 | 4/1993 |
| JP | A-5-47919 | 8/1993 |
| JP | A-5-226298 | 9/1993 |
| JP | A-11-162949 | 6/1995 |
| JP | 8-203863 | 8/1996 |
| JP | A-8-203864 | 8/1996 |
| JP | B2-2647884 | 5/1997 |
| JP | A-9-162168 | 6/1997 |
| JP | A-9-283535 | 10/1997 |
| JP | A-9-307101 | 11/1997 |
| JP | 9-330928 | 12/1997 |
| JP | A-9-330928 | 12/1997 |
| JP | A-9-331063 | 12/1997 |
| JP | A-11-229119 | 8/1998 |
| JP | 10-233387 | 9/1998 |
| JP | A-11-97523 | 4/1999 |
| JP | A-11-102961 | 4/1999 |
| JP | 11-135489 | 5/1999 |

* cited by examiner

METHOD OF FORMING A TRENCH WITH A ROUNDED BOTTOM IN A SEMICONDUCTOR DEVICE

CROSS REFERENCE TO RELATED APPLICATION

This application is based upon and claims the benefit of Japanese Patent Application No. 2000-51318 filed on Feb. 28, 2000, the contents of which are incorporated herein by reference.

BACKGROUND OF THE INVENTION

1. Field of the Invention

This invention relates to a method for manufacturing a semiconductor device having a trench formed on a semiconductor substrate, and to an insulated gate type power transistor.

2. Description of the Related Art

Recently, insulated gate type power transistors such as a MOS type power transistor and an IGBT type power transistor have adopted a trench-gate structure in which a gate is formed on a side wall of a trench so as to realize size reduction and low resistance of the device. In the trench-gate structure, the trench (deep groove) is formed on a silicon substrate by dry etching (anisotropic etching), and the gate is formed on this trench.

In an element adopting the trench-gate structure, however, electric field is liable to concentrate on an angular corner of the bottom portion of the trench, and the electric field concentration lowers a gate breakdown voltage in comparison with a device adopting a planar type structure. To solve this problem, in the conventional structure, isotropic etching is performed to the trench to round the corner of the bottom portion of the trench.

A process for rounding the corner of the bottom portion of the trench is explained as an example with reference to FIGS. 9A to 9D. In this process, first, as shown in FIG. 9A, a trench mask 102 is formed, with an opening 102a for trench formation, on a silicon substrate 101. Then, as shown in FIG. 9B, a trench 103 is formed on the silicon substrate 101 by anisotropic etching. The anisotropic etching produces a reaction product 104, and forms a layer of the reaction product 104 on the inner surface of the trench 103. Next, as shown in FIG. 9C, the reaction product 104 is removed from the inner surface of the trench 103. Successively, as shown in FIG. 9D, isotropic etching is performed to round the corner 103a of the bottom portion of the trench 103.

In the process, however, if isotropic etching is sufficiently performed to round the corner 103a of the trench 103, silicon is excessively etched, which adversely affects the trench formation and device design. For example, as shown in FIG. 9D, the opening 103b of the trench 103 may be undesirably widened. This makes it difficult to fine each width and an interval of trenches.

SUMMARY OF THE INVENTION

The present invention has been made in view of the above problems. An object of the present invention is to provide a method for manufacturing a semiconductor device with a trench that has a sufficiently rounded corner at a bottom portion thereof. Another object of the present invention is to provide a method for manufacturing a semiconductor device capable of preventing excessive etching of silicon to form a trench, and of fining the trench. Still another object of the invention is to provide an insulated gate type power transistor having a fine trench.

According to one aspect of the invention, when a trench is formed on a semiconductor substrate, first, anisotropic etching is performed to form the trench, which is accompanied by deposition of a reaction product on an inner wall of the trench. Then, isotropic etching is performed to round a corner of a bottom portion of the trench using the reaction product as a mask.

In this case, because the reaction product is produced during the anisotropic etching with a thickness that is thin on the bottom portion and is thick on a side wall of the trench, it can be used as the mask for rounding the corner sufficiently by the isotropic etching. The side wall of the trench, covered by the reaction product, is hardly etched by the isotropic etching, thereby preventing excessive etching of silicon. A fine structure of the trench can be realized accordingly.

Preferably, the isotropic etching is performed under an etching condition, which suppresses etching by ions in a thickness direction perpendicular to a surface of the semiconductor substrate and enhances etching by radicals in a lateral direction parallel to the surface of the semiconductor substrate.

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENT

A first embodiment of the invention is explained with reference to FIGS. 1 to 6, in which the invention is applied to an n-channel trench gate type IGBT.

Figure 2:
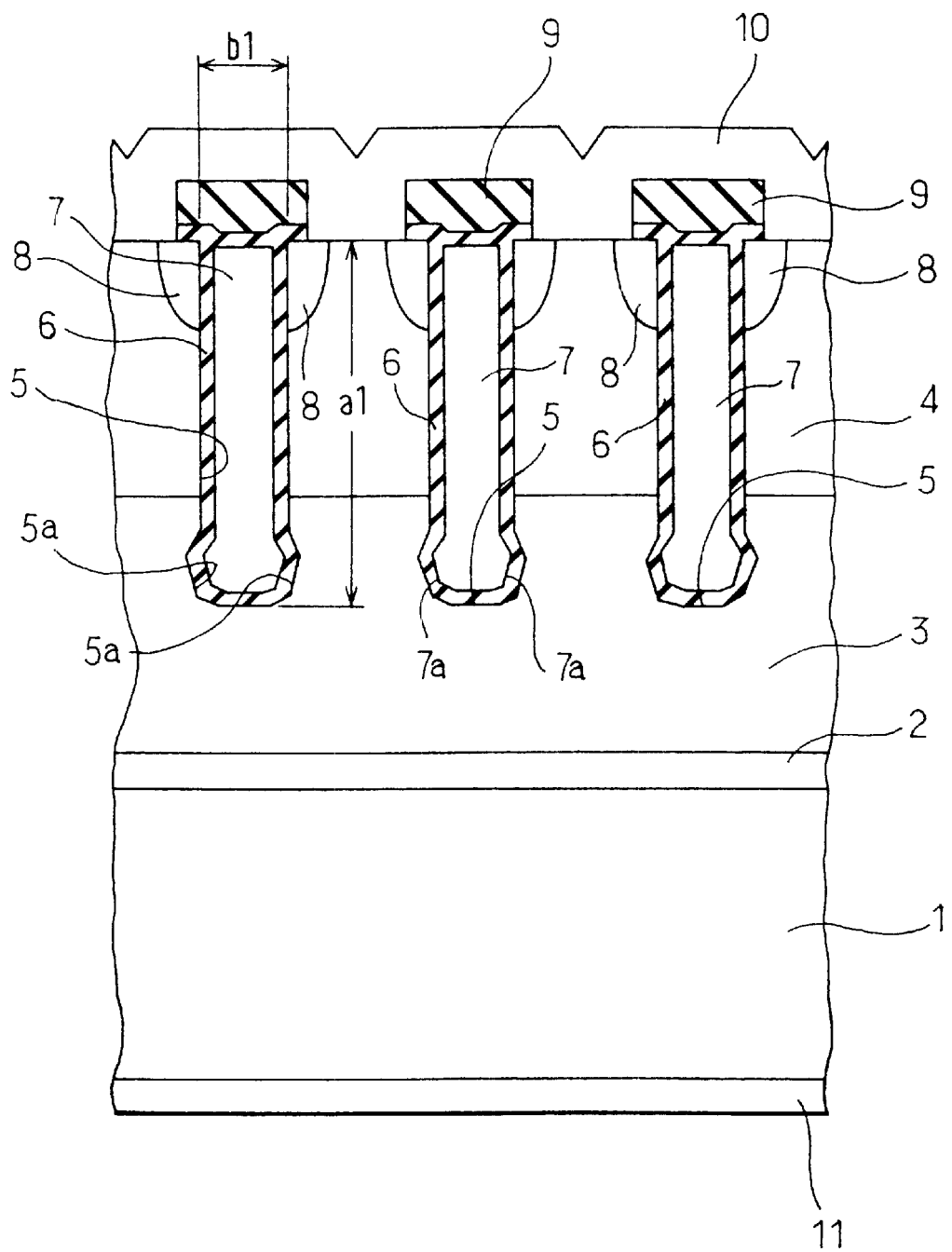
FIG. 2 is a cross-sectional view showing a trench gate type IGBT in the first embodiment.
Figure 3:
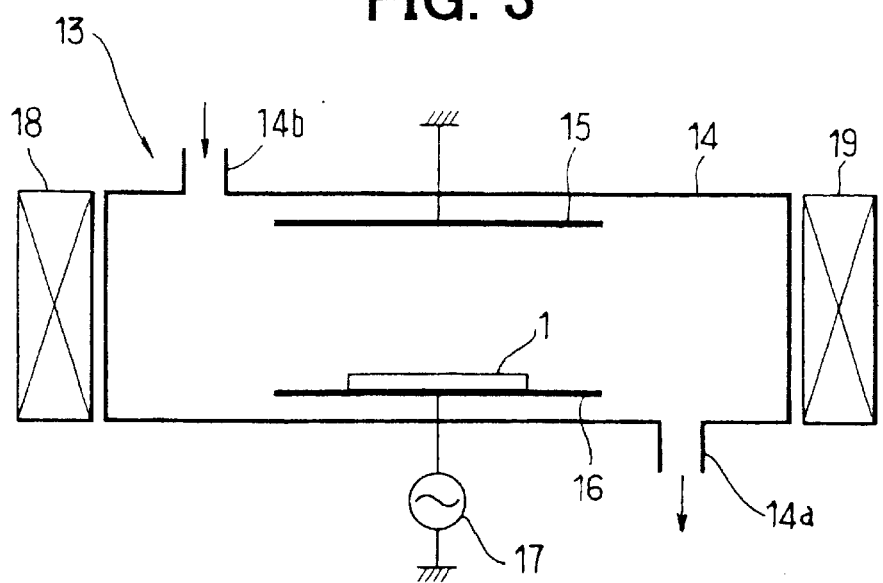
FIG. 3 is a cross-sectional view schematically showing an RIE apparatus.

First, referring to FIG. 2, in the trench gate type IGBT, an $n^+$ type silicon epitaxial layer 2, an n type silicon epitaxial layer 3, and a p type base diffusion layer 4 are formed on a $p^+$ type single crystal silicon substrate 1 that is formed for a collector.

Trenches 5 are formed on the surface of the P⁺ type single crystal silicon substrate 1 by a method described later. Each of the trenches 5 is formed with a lower end portion projecting in the n type silicon epitaxial layer 3, and has a rounded corner 5a at a bottom portion thereof. In this case, length dimension a1 in a vertical direction of the trench 5 in FIG. 2 is, for example, about 4 to 6 μm, and length dimension b1 in a lateral direction of the trench 5 in FIG. 2 is, for example, about 0.8 to 1.6 μm.

A gate oxide film 6 is formed on the trenches 5, and a gate electrode 7 is further formed on the gate oxide film 6. The gate oxide film 6 is made of, for example, a silicon oxide film with a thickness of about 100 nm in this embodiment. The thickness of the gate oxide film is preferably in a range of about 50 to 150 nm. The gate oxide film 6 may be composed of an ONO film (three-layer film composed of a silicon oxide film, a nitride film, and another silicon oxide film). In the case of using the ONO film, the thickness is preferably thin, which is, for example, about 60 nm.

The gate electrode 7 is made of, for example, n type polycrystalline silicon. Corner portions 7a as lower end portions of the gate electrode 7 are also rounded. Further, an n type emitter diffusion layer 8 is formed in the p type diffusion layer 4 at portions corresponding to the upper end portions of the trenches 5. An emitter electrode 10 is formed above the gate electrode 7 via an intermediate insulation 9. Further, a collector electrode 11 is formed, as a back surface electrode, on the back surface (lower surface in FIG. 2) of the p⁺ type single crystal silicon substrate 1 of the IGBT.

Next, the method for manufacturing the above-mentioned trench gate type IGBT is explained with reference to FIGS. 1A to 1E and 3. In the method for manufacturing the trench gate type IGBT of the present embodiment, the processes other than the process for forming a trench are substantially the same as those of a well-known method, and are therefore omitted here. Only the process for forming a trench is explained below.

Figure 1A:
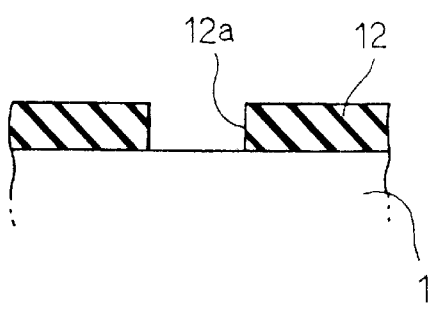
FIGS. 1A to 1E are cross-sectional views showing a method for forming a trench in a stepwise manner according to a first preferred embodiment of the present invention.

First, as shown in FIG. 1A, a trench mask 12 is formed on the silicon substrate 1, which has an opening portion 12a for forming the trench 5. In the present embodiment, an oxide film is used as the trench mask 12. Specifically, after an oxide film is formed by thermal oxidation to have a thickness of, for example, 40 nm, an oxide film is further formed by a plasma-enhanced CVD method to have a thickness of, for example, 0.35 μm, and then is annealed. The pattern (the opening portion 12a) is formed by photolithography and by dry etching. After that, resist coated for the pattern formation is removed. Incidentally, although the above-mentioned silicon layers 2, 3, 4, and the like are formed on the silicon substrate 1 previously to the above step by the well-known method, they are not shown in FIGS. 1A to 1E.

Figure 1B:
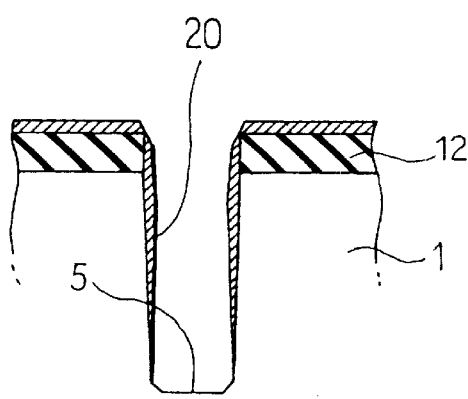

Successively, as shown in FIG. 1B, the trench 5 is formed on the silicon substrate 1 by anisotropic etching. This anisotropic etching is referred to as trench etching. This anisotropic etching is dry etching, and can be performed by using an RIE (Reactive Ion Etching) apparatus 13 shown in FIG. 3.

The RIE apparatus 13 is composed of an etching chamber 14, an upper electrode 15 and a lower electrode 16 disposed in the etching chamber 14, a high frequency power source 17 for applying high frequency power across the electrodes 15, 16, and magnetic coils 18, 19 disposed at both external ends of the etching chamber 14. In this structure, the silicon substrate (wafer) 1 is disposed on the lower electrode 16, and specific gas is introduced into the etching chamber 14. Then, anisotropic etching (that is, reactive ion etching) is performed while applying the high frequency power across the electrodes 15, 16 in state where specific magnetic field is made to act to the etching chamber 14.

The conditions of the anisotropic etching performed in the above-mentioned first step (STEP 1) of this embodiment are indicated in TABLE 1.

TABLE 1

|  | STEP 1: ANISOTROPIC ETCHING | | |
|---|---|---|---|
|  | EXAMPLE 1 | EXAMPLE 2 | EXAMPLE 3 |
| HBr (sccm) | 80 | 80 | 80 |
| SF₆ (sccm) | 3 | 2 | 3 |
| He, O₂ (sccm) | 20 | 20 | 20 |
| MAGNETIC FIELD INTENSITY (Gauss) | 65 | 65 | 65 |
| PRESSURE (mTorr) | 120 | 140 | 120 |
| HIGH FREQUENCY OUTPUT (W) | 600 | 600 | 400 |

TABLE 1 indicates three anisotropic etching conditions of example 1, 2, 3 that were practically performed in the present embodiment. The trench 5 was formed with a desirable shape by either of examples 1, 2, and 3. In the order of examples 1, 2, and 3, the degree of verticality of the side wall of the trench 5 became higher (that is, the angle between the substrate surface and the side wall of the trench 5 became closer to a right-angle, i.e., 90 degrees). In TABLE 1, the notation of He, O₂ means a mixture gas of He and O₂. The mixture gas used in the present embodiment had a mixing ratio of He and O₂ being 7:3 (that is, He:O₂=7:3).

Meanwhile, as shown in FIG. 1B, the anisotropic etching produces a reaction product 20 on the side wall of the trench 5 and on the surface of the trench mask 12. The reaction product 20 forms a protection film against the anisotropic etching, so that the portion covered by the reaction product 20 is not etched. On the other hand, an amount of the reaction product 20 attached to the bottom portion of the trench 5 is small, and its thickness is thin. Therefore, if isotropic etching is performed in the state where the reaction product 20 is attached, only the bottom portion of the trench 5 is etched, and the side wall of the trench 5 is hardly etched. As a result, the bottom portion of the trench 5 can be rounded. The present embodiment has been made in view of this point.

Figure 1C:
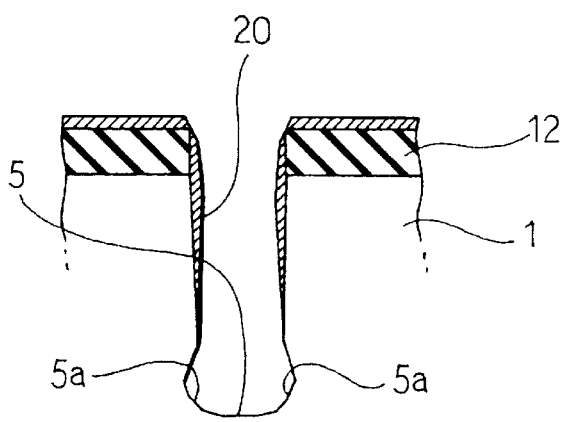

Specifically, in the present embodiment, after the above-mentioned STEP 1 is performed, as shown in FIG. 1C, isotropic etching is performed in state where the reaction product 20, formed on the inner wall of the trench 5 by the above-mentioned anisotropic etching, is not removed. As a result, the corner 5a of the bottom portion of the trench 5 is rounded. This process is a second step (STEP 2). In the present embodiment, dry etching is performed as the above-mentioned isotropic etching. The conditions of the isotropic etching performed in the second step (STEP 2) are indicated in TABLES 2 and 3 below.

TABLE 2

|  | STEP 2: ISOTROPIC ETCHING EXAMPLE 4 |
|---|---|
| HBr (sccm) | 0 |
| SF₆ (sccm) | 40 |
| He, O₂ (sccm) | 0 |
| MAGNETIC FIELD INTENSITY (Gauss) | 20 |

TABLE 2-continued

| | STEP 2: ISOTROPIC ETCHING EXAMPLE 4 |
|---|---|
| PRESSURE (mTorr) | 300 |
| HIGH FREQUENCY OUTPUT (W) | 200 |

TABLE 3

| | STEP 2: ISOTROPIC ETCHING EXAMPLE 5 |
|---|---|
| $CF_6$ (sccm) | 98 |
| $O_2$ (sccm) | 52 |
| PRESSURE (mTorr) | 300 |
| HIGH FREQUENCY OUTPUT (W) | 1000 |

TABLES 2 and 3 show isotropic etching conditions of examples 4 and 5 that were practically performed in the present embodiment. In either of examples 4, 5, the corner 5a of the bottom portion of the trench 5 was desirably rounded.

The isotropic etching of example 4 (TABLE 2) was performed, following the anisotropic etching at STEP 1, successively in the RIE apparatus 13. In this case, because the isotropic etching of example 4 was performed in the RIE apparatus 13 suitable for anisotropic etching, it was not completely isotropic. In the example 4, the high frequency output (RF power) and the magnetic field intensity are lessened as compared to those in the examples 1 to 3, and only gas containing F that can exhibit a high etching effect in a lateral direction as a radical is used as the etching gas. Accordingly, the isotropy is enhanced in the example 4. The etching rate of the depth direction and the lateral direction was about 2.3:1.

Also, in the present embodiment, in the case of shifting from STEP 1 (any one of examples 1, 2, and 3) to STEP 2 (example 4), the power (plasma) is turned OFF once, and gas is discharged from the etching chamber 14 through a discharge port 14a. Then, gas is newly introduced into the etching chamber 14 through a supply port 14b, thereby replacing gas. After gas flow is stabilized in the etching chamber 14, the power (plasma) is turned ON to execute etching. STEP 1 (examples 1, 2, and 3) and STEP 2 (example 4) may be performed in different RIE apparatuses from each other.

Figure 4:
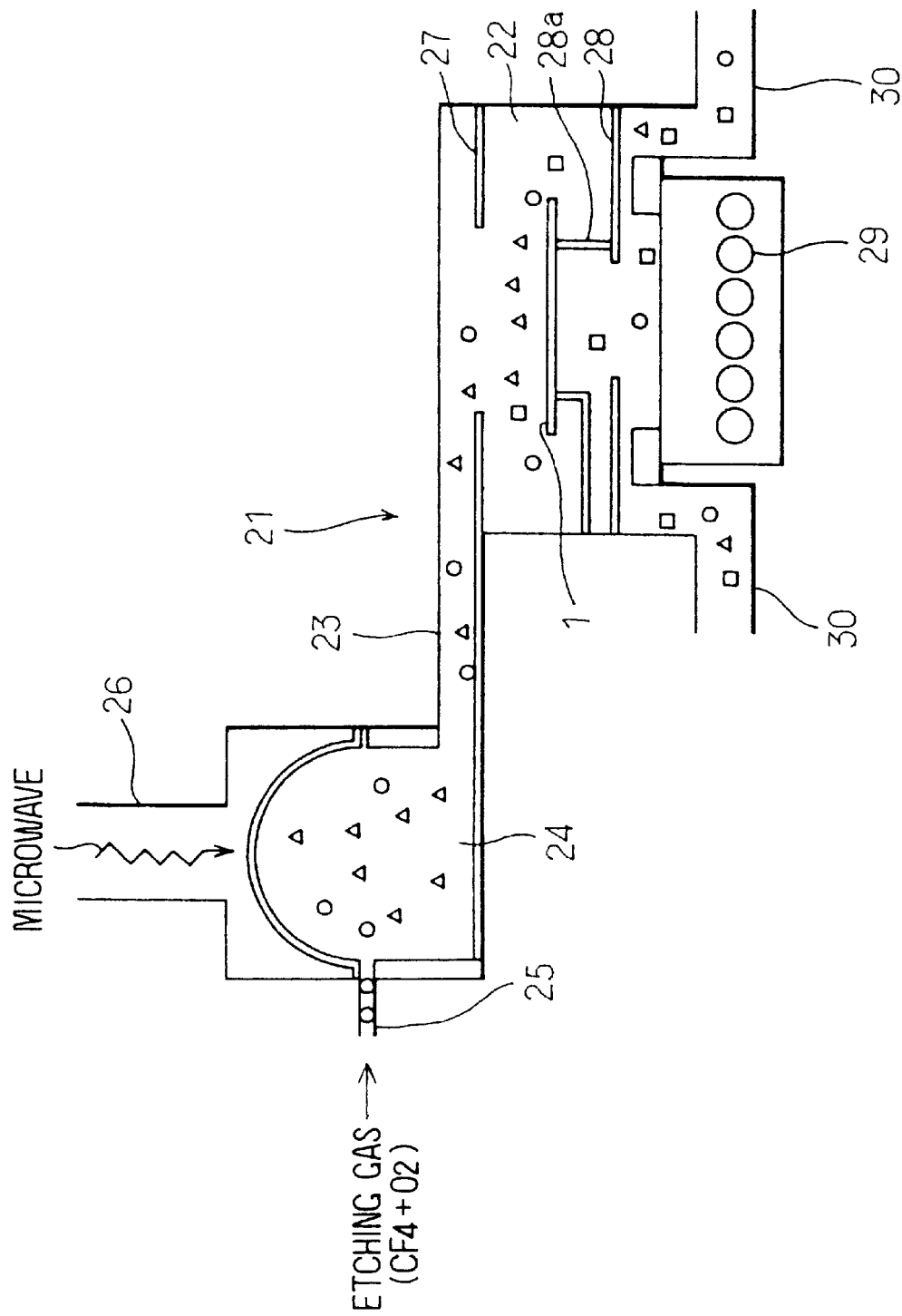
FIG. 4 is a cross-sectional view schematically showing a CDE apparatus.

On the other hand, the isotropic etching of example 5 (TABLE 3) at STEP 2 was performed in a well-known CDE (Chemical Dry Etching) apparatus 21 shown in FIG. 4. Because the CDE apparatus 21 uses mainly radicals for etching, the isotropy of etching is improved as compared to that in example 4. The CDE apparatus 21 is explained briefly below with reference to FIG. 4.

As shown in FIG. 4, the CDE apparatus 21 has an etching reaction chamber 22, and a plasma generation chamber 24 communicating with the etching reaction chamber 22 via a gas passage 23. The plasma generation chamber 24 is formed with a gas introduction port 25 for introducing etching gas, and $CF_4$ and $O_2$ are supplied into the plasma generation chamber 24 as etching gas through the gas introduction port 25. Microwave is radiated into the plasma generation chamber 24 through a waveguide 26. The radiated microwave excites and activates etching gas inside the chamber 24 by bringing it in a plasma state, and activated etching gas is introduced into the etching reaction chamber 22 through the gas passage 23.

In the etching reaction chamber 22, a gas guide plate 27 is provided at an upper portion thereof, and a substrate disposal portion 28 is provided at a lower portion thereof. The substrate disposal portion 28 is so constructed that the silicon substrate (wafer) 1 can be supported by a support pin 28a. A lamp 29 for heating is disposed under the silicon substrate 1. Discharge ports 30 are provided at the side portions of the lamp 29 under the substrate disposal portion 28. Incidentally, in FIG. 4, marks ○ represent etching gas before excitation, marks Δ represent activated etching gas, and marks □ represent reaction products produced by etching.

In the present embodiment, when example 1 is selectively performed at STEP 1, either of examples 4, 5 may be performed at STEP 2. Likewise, when example 2 or 3 is selectively performed at STEP 1, either of examples 4, 5 may be performed at STEP 2. In case of any combination described above, the corner 5a of the bottom portion of the trench 5 can be rounded properly.

In the present embodiment, the isotropic etching of examples 4, 5 at STEP 2 is dry etching; however, it is not limited to that. For example, it may be wet etching using a mixing solution of $HF/HNO_3$. This wet etching can also round the corner 5a of the trench 5 sufficiently.

Figure 1D:
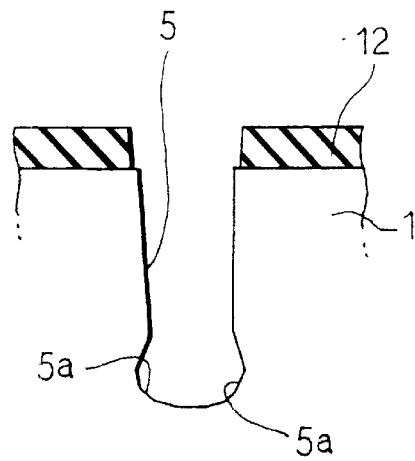
Figure 1E:
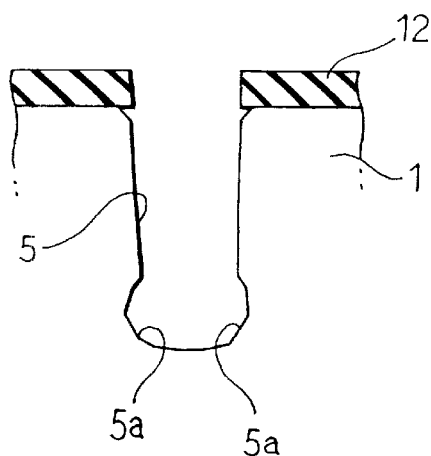

After STEP 2 is carried out, as shown in FIG. 1D, the reaction product 20 is removed by diluted HF solution because the reaction product 20, produced during the anisotropic etching at STEP 1, is a film made of an oxide ($SiO_2$) based material. After the reaction product 20 is removed, as shown in FIG. 1E, isotropic etching is further performed by using the CED apparatus 21 under the same condition as that of example 5 at STEP 2. According to this isotropic etching, not only the corner 5a of the bottom portion of the trench 5 is further rounded but also the upper corner of the trench 5 is rounded. Incidentally, the isotropic etching shown in FIG. 1E corresponds to the isotropic etching showing in FIG. 9D in the conventional method.

Further, in the present embodiment, after the isotropic etching is performed, an annealing step is performed to remove damages in, for example, nitrogen atmosphere at 1000° C. After that, sacrificial oxidation is performed by an ordinary well-known method to remove a damaged layer, and the gate oxide film 6 is formed with a thickness of 100 nm. Then, polycrystalline silicon (poly Si) is embedded in the trench 5 to form the gate electrode 7.

According to the present embodiment adopting the manufacturing method described above, even when the etching amount of the isotropic etching shown in FIG. 1E is small, the corner 5a of the bottom portion of the trench 5 can be rounded sufficiently. Therefore, the corner 5a can have a large radius of curvature. Hereinafter, the effects of the present embodiment are explained with reference to FIGS. 5 and 6, in comparison with the conventional method.

Figure 9A:
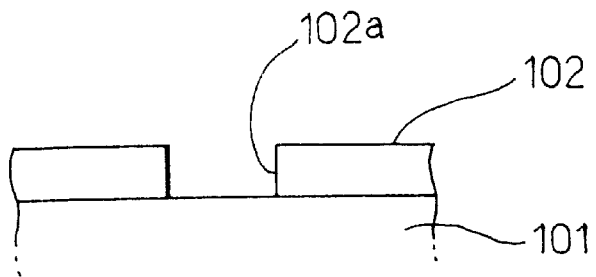
FIGS. 9A to 9D are cross-sectional views showing a method for forming a trench according to a prior art.
Figure 9B:
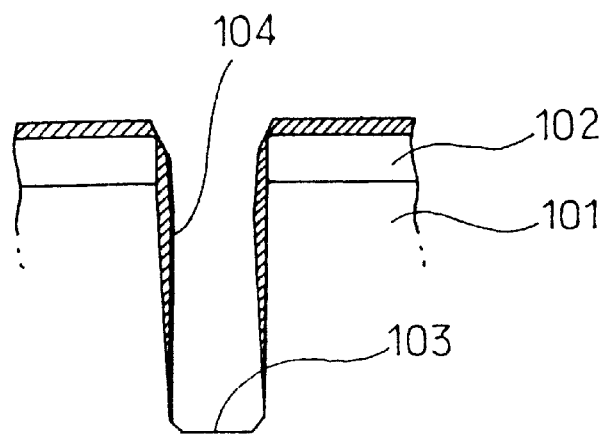
Figure 9C:
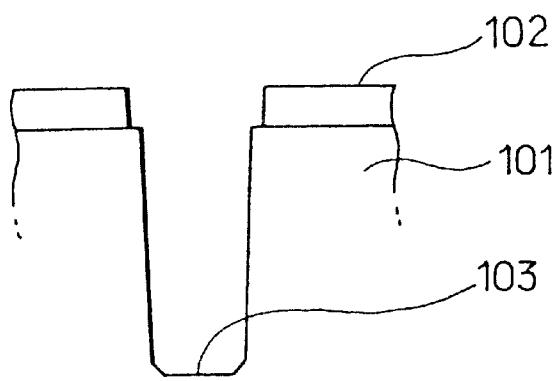
Figure 9D:
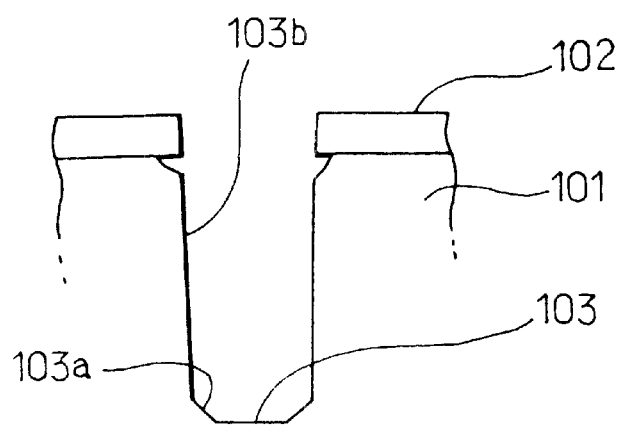

As described above, in the present embodiment, the anisotropic etching at STEP 1, the isotropic etching at STEP 2, and the isotropic etching at the step shown in FIG. 1E are performed successively. To the contrary, in the conventional method, only the anisotropic etching shown in FIG. 9B and the isotropic etching shown in FIG. 9D are performed. According to this difference, when the etching amount of the isotropic etching performed at the last step in the present embodiment is set to be equal to that of the conventional method, the corner 5a of the trench 5 formed in the present embodiment can have a radius of curvature r1 larger than a radius of curvature r2 of the corner formed by the conventional method.

This is because, in the present embodiment, the isotropic etching (STEP 2) is performed in the state where the reaction product 20 is not removed after the trench 5 is formed by the anisotropic etching (STEP 1). Here, the isotropic etching (STEP 2) performed in the sate where the reaction 20 is not removed is referred to as a bottom portion isotropic etching in the present embodiment.

That is, according to the present embodiment, the radius of curvature r1 of the corner 5a of the bottom portion of the trench 5 can be controlled easily by the etching amount of the bottom portion isotropic etching and the etching amount of the isotropic etching (shown in FIG. 1E). Even when the etching amount of the isotropic etching (shown in FIG. 1E) is small, the corner 5a of the trench 5 can be rounded amply while preventing silicon from being etched excessively. As a result, the trench width is prevented from being widened undesirably, and fined trenches can be formed easily.

Figure 5:
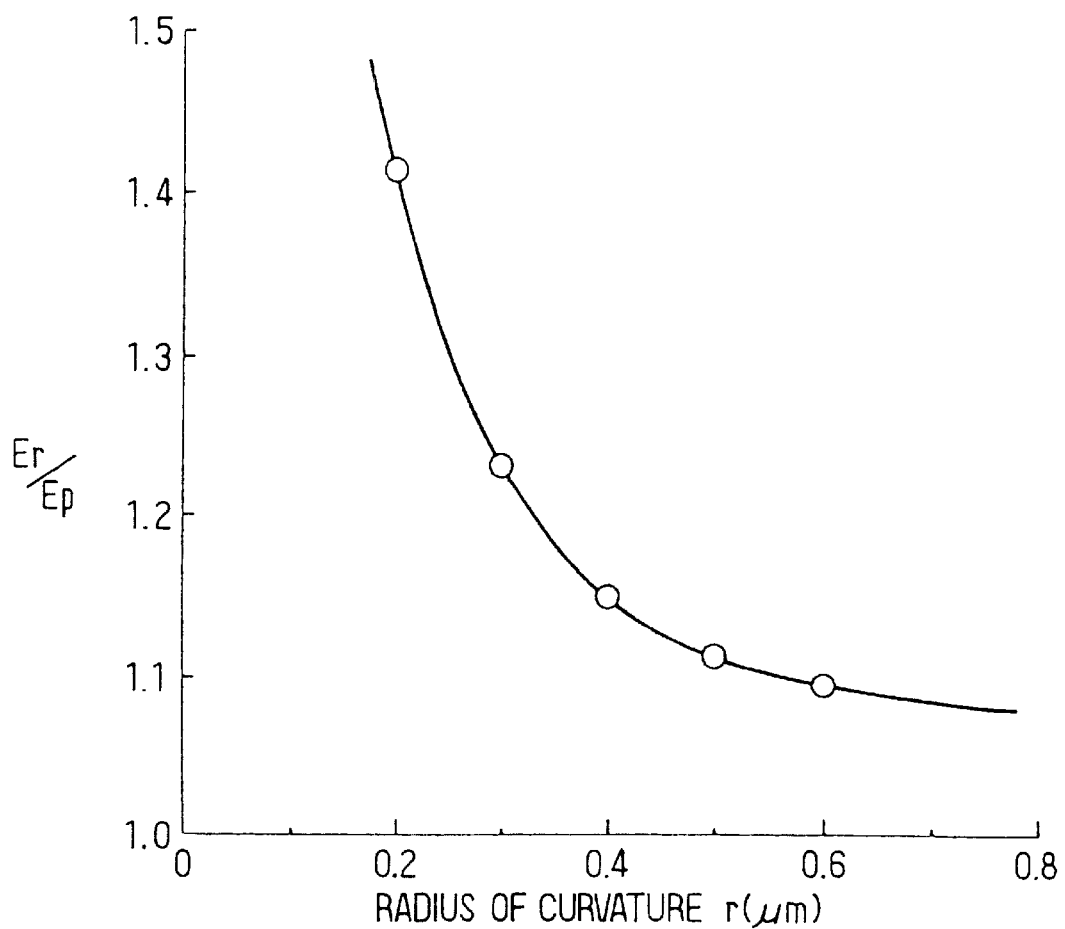
FIG. 5 is a graph showing a relation between a radius of curvature of a corner of the bottom portion of the trench and an electric field intensity ratio Er/Ep representing a degree of electric field concentration.

In this connection, FIG. 5 shows a relation between the radius of curvature r of the corner 5a of the bottom portion of the trench 5 and an electric field intensity ratio Er/Ep representing the degree of electric field concentration. Er represents an electric field intensity at the corner 5a of the trench 5, and EP represents an electric field intensity at a flat portion of the side wall of the trench 5. According to FIG. 5, it is revealed that as the electric field intensity ratio Er/Ep approaches 1, i.e., as it is decreased, the electric field concentration at the bottom trench corner is lessened. It is further revealed that the smaller the radius of curvature of the corner 5a is, the more the electric field concentrates, and that the electric field concentration is decreased remarkably if the radius of curvature is about 0.3 to 0.5 $\mu$m. Incidentally, the graph of FIG. 5 shows the data in the case where thickness Tox of the gate oxide film is 0.1 $\mu$m (100 nm).

Figure 6:
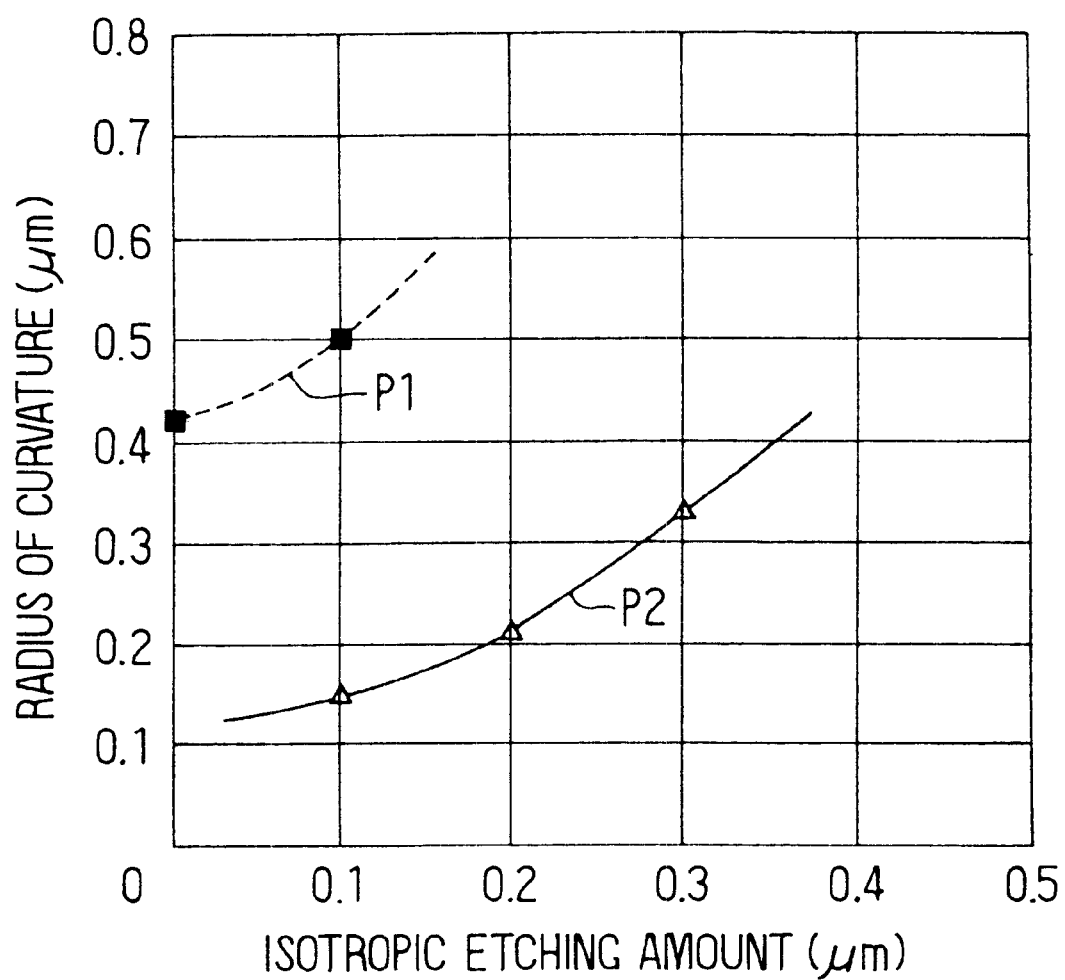
FIG. 6 is a graph showing a relation between an etching amount of isotropic etching and the radius of curvature r of the corner of the bottom portion of the trench.

FIG. 6 shows a relation of the etching amount of the isotropic etching (isotropic etching amount) and the radius of curvature r of the corner 5a of the trench 5. In FIG. 6, broken curve P1 indicates the present embodiment, while solid curve P2 indicates the conventional method. In the present embodiment represented by the broken curve P1, after STEP 1 was performed for 375 seconds under the condition of example 1, STEP 2 was performed for 20 seconds under the condition of example 4 using the same etching chamber. In this case, the etching amount at STEP 1 was 5 $\mu$m, and the etching amount at STEP 2 was 0.45 $\mu$m in the depth direction and was 0.2 $\mu$m in the horizontal direction. According to FIG. 6, it is revealed clearly that the radius of curvature of the corner 5a of the trench 5 formed in the present embodiment is significantly larger than that formed by the conventional method in case where the etching amount of the isotropic etching performed at the step shown in FIG. 1E of the present embodiment is set to be identical with that of the conventional method.

Further, in the present embodiment, in either of the case where isotropic etching is not performed at all and the case where the etching amount of the isotropic etching is 0.1 $\mu$m, the radius of curvature r of the corner 5a of the trench 5 falls in a range of about 0.3 to 0.5, which is sufficiently large. The corner 5a having the radius of curvature falling in such a range can reduce electric field concentration thereon remarkably. Incidentally, when the etching amount of the isotropic etching is 0.2 $\mu$m or more, the upper portion width of the trench 5 is increased. The increased upper portion width is disadvantageous to fine (miniaturize in width) the trench 5.

Figure 7:
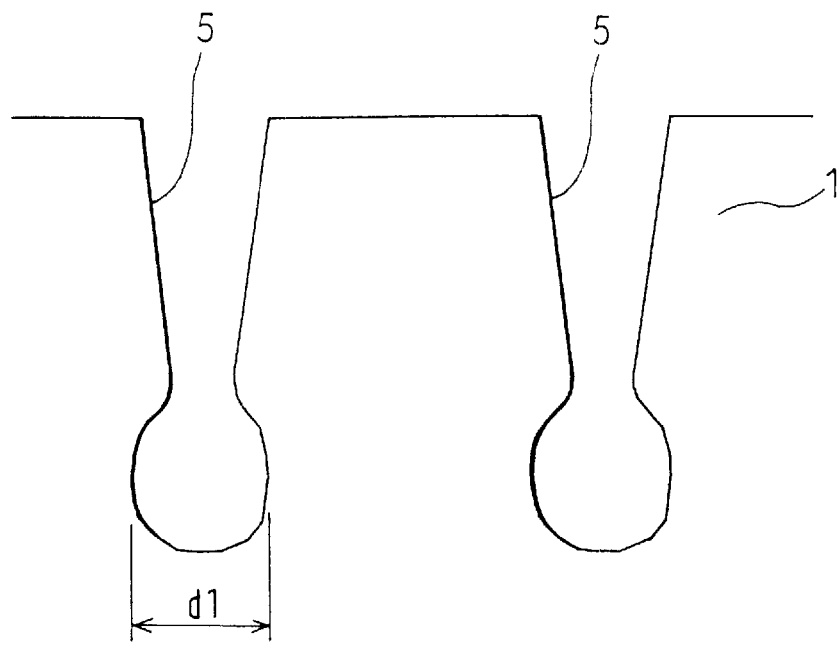
FIG. 7 is a cross-sectional view schematically showing a shape of trenches in a second preferred embodiment of the invention.

FIG. 7 shows a second embodiment of the invention, in which the same parts as those in the first embodiment are indicated by the same reference numerals. In the second embodiment, as shown in FIG. 7, the anisotropic etching condition is controlled so that an angle of the side wall of the trench 5 is smaller than a right angle (90 degrees) with respect to the substrate surface and so that the trench 5 is tapered from the substrate surface in the depth direction. The tapered side wall of the trench 5 can decrease the width d1 of the bottom portion of the trench 5.

Figure 8:
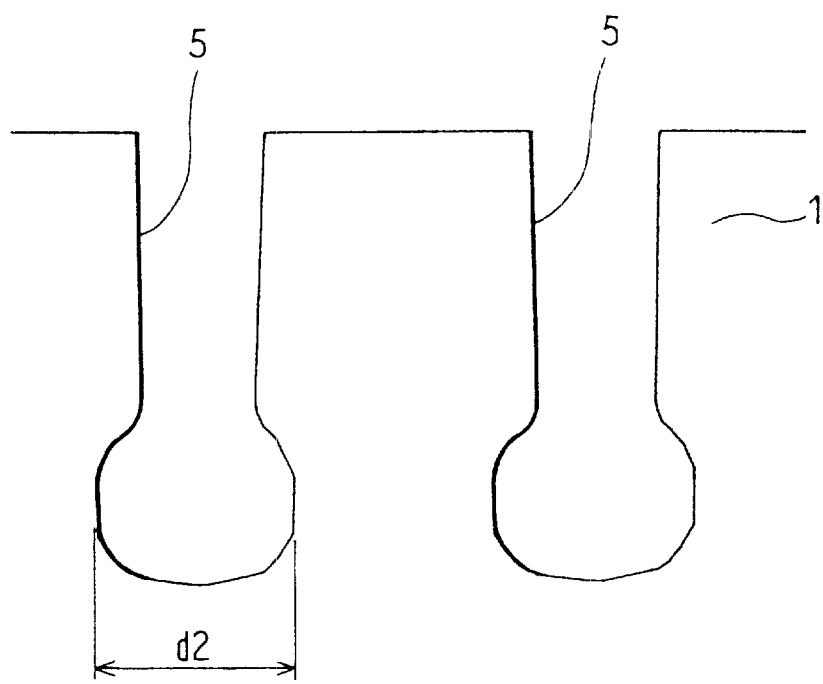
FIG. 8 is a cross-sectional view schematically showing a shape of trenches as a comparative example.

Here, FIG. 8 shows an example having the angle of the side wall of the trench 5 that is about a right angle (90 degrees) with respect to the substrate surface. In the case of FIG. 8, the width d2 of the bottom portion of the trench 5 is relatively large. If the width of the bottom portion of the trench is large, when an interval of trenches is narrowed for a fine structure, the expanding portion at the bottom of each trench narrows a current path and increases an ON voltage. In consequence, the element becomes liable to be broken thermally.

As opposed to this, in the case of the second embodiment shown in FIG. 7, the expanding degree of the bottom portion of the trench 5 is small. Therefore, the current path can be prevented from being narrowed, thereby preventing the deterioration in device characteristics. In this case, it is preferable that the trench 5 has the width (maximum width) of the bottom portion that is equal to or smaller than the width of the upper portion opening thereof in the state after the isotropic etching is performed as shown in FIG. 1E. If the widths of the trench 5 are controlled as above, that is, if the angle of the tapered shape is controlled to have the dimensional relation as mentioned above, it is advantageous to fine the trench 5.

In the embodiments described above, although the present invention is applied to the n channel trench gate type IGBT, it is not limited to this but may be applied to a p channel trench gate type IGBT or other semiconductor elements (such as MOSFET) having a trench gate structure. The present invention may also be applied to semiconductor devices having a trench (STI: Shallow Trench Isolation) for isolation.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method for manufacturing a semiconductor device, comprising:

performing anisotropic etching to form a trench on a semiconductor substrate, the anisotropic etching being accompanied by deposition of a reaction product on an inner wall of the trench; and performing isotropic etching to round a corner of a bottom portion of the trench using the reaction product as a mask, wherein the isotropic etching is wet etching.

2. A method for manufacturing a semiconductor device, comprising:

performing anisotropic etching to form a trench on a semiconductor substrate, the anisotropic etching being accompanied by deposition of a reaction product on an inner wall of the trench; and performing isotropic etching to round a corner of a bottom portion of the trench using the reaction product as a mask, wherein the trench is formed by the anisotropic etching to have a side wall that is tapered from a surface of the semiconductor substrate in a depth direction.

3. The method of claim 2, wherein the anisotropic etching is performed under an etching condition such that a maximum width of the bottom portion of the trench is approximately smaller than a width of an upper portion of the trench after the isotropic etching is performed.

4. A method for manufacturing a semiconductor device, comprising:

performing anisotropic etching to form a trench on a semiconductor substrate, the anisotropic etching being accompanied by deposition of a reaction product on an inner wall of the trench; and performing isotropic etching to round a corner of a bottom portion of the trench using the reaction product as a mask, wherein the anisotropic etching is performed in an etching apparatus in which the anisotropic etching and the isotropic etching are performed successively.

5. A method for manufacturing a semiconductor device, comprising:

performing anisotropic etching to form a trench on a semiconductor substrate, the anisotropic etching being accompanied by deposition of a reaction product on an inner wall of the trench; and performing isotropic etching to round a corner of a bottom portion of the trench using the reaction product as a mask, wherein the isotropic etching is dry etching that is performed using a gas containing fluorine.

6. The method of claim 5, wherein the isotropic etching is performed under an etching condition that suppresses etching by ions in a direction perpendicular to a surface of the semiconductor substrate and improves etching by radicals in a lateral direction, which is parallel to the surface of the semiconductor substrate.

7. A method for manufacturing a semiconductor device, comprising:

performing anisotropic dry etching to form a trench on a semiconductor substrate, the anisotropic dry etching being accompanied by deposition of a reaction product on sidewalls of the trench; and performing isotropic dry etching while the sidewalls of the trench are protected from the isotropic dry etching by the reaction product deposited during the anisotropic dry etching to round a corner of a bottom portion of the trench.

8. The method of claim 7, wherein the isotropic dry etching is performed under an etching condition that is selected to suppress etching by ions and to improve etching by radicals.

9. The method of claim 8, wherein the anisotropic etching is performed using a gas containing bromine, fluorine and oxygen.

10. The method of claim 9, wherein the isotropic etching is performed using a gas containing fluorine.

11. The method of claim 8, wherein the isotropic etching is performed using a gas containing fluorine.

12. A method for manufacturing a semiconductor device, comprising:

performing anisotropic etching to form a trench on a semiconductor substrate, the anisotropic etching being accompanied by deposition of a reaction product on an inner wall of the trench;

performing a first isotropic etching to round a corner of a bottom portion of the trench using the reaction product as a mask;

removing the reaction product from the inner wall of the trench after the first isotropic etching is performed; and performing a second isotropic etching after the reaction product is removed.

13. The method of claim 12, further comprising performing annealing for removing damage after the second isotropic etching is performed.

14. The method of claim 13, further comprising performing sacrificial oxidation after the annealing is performed.

15. The method of claim 12, further comprising performing sacrificial oxidation after the second isotropic etching is performed.

16. The method of claim 12, wherein the first and second isotropic etchings are dry etchings that are performed using a gas containing fluorine.

17. The method of claim 16, wherein the anisotropic etching is performed using a gas containing bromine, fluorine and oxygen.

18. A method for manufacturing a semiconductor device, comprising:

performing anisotropic etching to form a trench on a semiconductor substrate, the anisotropic etching being accompanied by deposition of a reaction product on an inner wall of the trench;

performing isotropic etching to round a corner of a bottom portion of the trench using the reaction product as a mask;

removing the reaction product from the inner wall of the trench after the isotropic etching is performed; and performing annealing for removing damage after the reaction product is removed.

19. The method of claim 18, further comprising performing sacrificial oxidation after the annealing is performed.

20. A method for manufacturing a semiconductor device, comprising:

performing anisotropic etching to form a trench on a semiconductor substrate, the anisotropic etching being accompanied by deposition of a reaction product on an inner wall of the trench;

performing isotropic etching to round a corner of a bottom portion of the trench using the reaction product as mask;

removing the reaction product from the inner wall of the trench after the isotropic etching is performed; and performing sacrificial oxidation after the reaction product is removed.

21. A method for manufacturing a semiconductor device, comprising:

performing anisotropic etching to form a trench on a semiconductor substrate, the anisotropic etching being accompanied by deposition of a reaction product on an inner wall of the trench; and performing isotropic etching to round a corner of a bottom portion of the trench using the reaction product as a mask, wherein:
the anisotropic etching is performed using a first gas containing bromine, fluorine and oxygen; and
the isotropic etching is performed using a second gas, which is different from the first gas.

22. The method of claim 21, wherein the second gas contains fluorine.

23. A method for manufacturing a semiconductor device, comprising:

performing anisotropic etching to form a trench on a semiconductor substrate, the anisotropic etching being accompanied by deposition of a reaction product on an inner wall of the trench; and performing isotropic etching to round a corner of a bottom portion of the trench using the reaction product as a mask, wherein the corner is rounded to have a radius of curvature in range of about 0.3 μm to 0.5 μm.

24. A method for manufacturing a semiconductor device, comprising:

performing anisotropic etching to form a trench on a semiconductor substrate, the anisotropic etching being accompanied by deposition of a reaction product on an inner wall of the trench; and performing isotropic etching to round a corner of a bottom portion of the trench using the reaction product as a mask, wherein:

the reaction product produced by the anisotropic etching is made of an oxide based material and deposited on the inner wall of the trench;

the thickness of the reaction product at the bottom portion of the trench is less than that at the inner wall at locations other than the bottom portion; and the isotropic etching is performed to round the corner through the reaction product.

25. A method for manufacturing a semiconductor device, comprising:

performing anisotropic etching to form a trench on a semiconductor substrate, the anisotropic etching being accompanied by deposition of a reaction product on an inner wall of the trench; and performing isotropic etching to round a corner of a bottom portion of the trench using the reaction product as a mask, wherein the bottom portion of the trench is expanded in a lateral direction by the isotropic etching to form a laterally expanded portion of the trench.

26. The method of claim 25, wherein:

the trench is formed by the anisotropic etching to taper from a surface of the semiconductor substrate in a depth direction; and the expanded portion is formed by the isotropic etching to have a width that is smaller than that of an opening portion of the trench.

* * * * *